(12) United States Patent
Zhang et al.

(10) Patent No.: US 11,048,291 B2
(45) Date of Patent: Jun. 29, 2021

(54) HIGH SPEED FLEXLED DIGITAL INTERFACE

(71) Applicant: TEXAS INSTRUMENTS INCORPORATED, Dallas, TX (US)

(72) Inventors: Ruochen Zhang, Shanghai (CN); Wei Xu, Jiangsu (CN); Hongyan Wu, Shanghai (CN); Qingjie Ma, Shanghai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 51 days.

(21) Appl. No.: 16/218,664

(22) Filed: Dec. 13, 2018

(65) Prior Publication Data

US 2020/0042032 A1 Feb. 6, 2020

Related U.S. Application Data

(63) Continuation of application No. PCT/CN2018/098209, filed on Aug. 2, 2018.

(51) Int. Cl.
*G06F 1/08* (2006.01)
*H04J 3/06* (2006.01)
*H03L 7/07* (2006.01)
*H04B 7/26* (2006.01)

(52) U.S. Cl.
CPC .............. *G06F 1/08* (2013.01); *H03L 7/07* (2013.01); *H04B 7/269* (2013.01); *H04J 3/0688* (2013.01)

(58) Field of Classification Search
CPC ... G06F 1/08; H03L 7/07; H04B 7/269; H04J 3/0688
See application file for complete search history.

(56) References Cited

U.S. PATENT DOCUMENTS

| | | | |
|---|---|---|---|
| 6,370,188 B1 | 4/2002 | Wu et al. | |
| 7,190,690 B2 * | 3/2007 | Tuomela | H04W 72/02 370/347 |
| 7,190,909 B2 * | 3/2007 | Das | H04B 10/0775 398/202 |

(Continued)

FOREIGN PATENT DOCUMENTS

| | | |
|---|---|---|
| CN | 1254426 A | 5/2000 |
| CN | 204217046 U | 3/2015 |

OTHER PUBLICATIONS

Search Report for PCT Application No. PCT/CN20181098209, date of mailing of the international search report dated Apr. 28, 2019, 2 pages.

*Primary Examiner* — Aurel Prifti
(74) *Attorney, Agent, or Firm* — Mark Allen Valetti; Charles A. Brill; Frank D. Cimino

(57) ABSTRACT

A system for a network of one or more off-board subsystems is provided for controlling automobile subsystems such as vehicle lighting. Such a system may be compatible with a universal asynchronous receiver transmitter (UART) interface and it may address timing issues by using a protocol having a synchronization frame (sync frame) such that a clock signal may be recovered from the sync frame sent by an off-board master device 202, such as a microcontroller unit 208, to a satellite/slave 211 device. Such a protocol permits elimination of a crystal clock oscillator and phase-locked loop located at satellite, thereby dispensing with an otherwise significant cost.

12 Claims, 8 Drawing Sheets

(56) References Cited

U.S. PATENT DOCUMENTS

| | | | | |
|---|---|---|---|---|
| 7,564,283 B1* | 7/2009 | Logue | G06F 1/10 | 327/234 |
| 8,373,643 B2* | 2/2013 | Zhao | G09G 3/3406 | 345/102 |
| 9,575,525 B2* | 2/2017 | Asano | G06F 1/26 | |
| 9,825,724 B2* | 11/2017 | Licardie | H04J 3/0658 | |
| 2005/0065649 A1* | 3/2005 | Rosenfeld | G09B 9/04 | 700/245 |
| 2005/0079883 A1* | 4/2005 | Khawand | H04W 56/002 | 455/502 |
| 2005/0151592 A1* | 7/2005 | Partridge | H03L 7/08 | 331/16 |
| 2007/0056487 A1* | 3/2007 | Anthony | F23C 10/26 | 110/345 |
| 2008/0086654 A1* | 4/2008 | Sogabe | G06F 1/3203 | 713/501 |
| 2008/0139200 A1* | 6/2008 | Zhu | H04W 16/14 | 455/426.1 |
| 2008/0255718 A1* | 10/2008 | Tuff | G07C 5/0858 | 701/32.6 |
| 2009/0228732 A1* | 9/2009 | Budde | H04J 3/0664 | 713/400 |
| 2009/0243655 A1* | 10/2009 | Nascimento | G06F 13/4072 | 326/83 |
| 2010/0120389 A1* | 5/2010 | Blum | H03L 7/07 | 455/208 |
| 2010/0219894 A1* | 9/2010 | Rogers | H03L 7/087 | 331/1 A |
| 2010/0315138 A1* | 12/2010 | Namba | H03L 1/026 | 327/157 |
| 2011/0218748 A1* | 9/2011 | Wang | B60L 58/12 | 702/63 |
| 2011/0228834 A1* | 9/2011 | Umayabashi | H03L 7/08 | 375/224 |
| 2012/0179950 A1* | 7/2012 | He | H04L 7/048 | 714/752 |
| 2012/0219099 A1* | 8/2012 | Loukianov | G06F 1/14 | 375/357 |
| 2013/0259095 A1* | 10/2013 | Chen | G06F 13/385 | 375/211 |
| 2015/0085411 A1* | 3/2015 | Yang | H04L 43/08 | 361/57 |
| 2016/0084657 A1* | 3/2016 | Schilling | G01C 21/165 | 701/29.1 |
| 2016/0314092 A1* | 10/2016 | Suzuki | G06F 1/10 | |
| 2017/0060172 A1* | 3/2017 | Lim | G01S 19/235 | |
| 2017/0170853 A1 | 6/2017 | Megard et al. | | |
| 2017/0171051 A1* | 6/2017 | Joo | H04L 47/13 | |
| 2018/0292543 A1* | 10/2018 | McFarland | G01S 19/51 | |
| 2018/0373659 A1* | 12/2018 | Amarilio | H04R 3/12 | |
| 2019/0013888 A1* | 1/2019 | Li | H04J 3/0688 | |
| 2019/0034368 A1* | 1/2019 | Sanghi | G06F 13/28 | |
| 2019/0385057 A1* | 12/2019 | Litichever | H04L 63/1416 | |
| 2019/0386763 A1* | 12/2019 | Rentschler | H04L 43/0829 | |

\* cited by examiner

HIGH SPEED FLEXLED DIGITAL INTERFACE

Cost and complexity are constant concerns in the automotive industry and attention has been focused on reducing costs for systems which may tolerate less redundancy, and cheaper operation. One such area involves vehicle lighting. Wiring harnesses which require multiple wired and complicated connections, in addition to being expensive, provide potentially more numerous sites for connection failure in addition to requiring more materials. FIG. 1 illustrates a layout of a wiring arrangement for automobile 100. Body control module (BCM) 102 is connected by multiple wires 104 connecting front lights, left 106 and right 108, (FL-L and FL-R, respectively). Additionally, body control module (BCM) 102 is connected by multiple wires 105 connecting rear lights, left 110 and right 112, (RL-L and RL-R, respectively). Reducing the number of wires for connecting automobile wiring, such as those in harness wiring, is a step in the right direction. A Controller area network (CAN) bus or a Local Interconnect Network (LIN) bus may be adapted to provide monitoring and control of lighting systems, among other things. The CAN bus is a serial communications bus that was developed for the automotive industry to permit error detection and error correction and also replace a multi-wired wiring harness with a two-wire bus. The LIN bus was developed to create a standard for low-cost, multiplexed communication in automotive networks that would be cheaper than the CAN bus as the CAN bus is well-suited for higher bandwidth networks making use of more complicated error correction techniques. However, using strictly a CAN approach to controlling systems, such as lighting, may result in an overly expensive and overly complicated solution. LIN on the other hand, is generally not fast enough to provide sophisticated control of a system such as vehicle lighting. In one solution, drivers may be used in conjunction with separate controller units, on-board, having on-chip clock sources, such as crystal clock oscillators for both master and slave/satellite location sites. However, controllers with a crystal clock oscillator source on each printed circuit board or module, represent a level of redundancy that could be beneficially eliminated in order to achieve goals of lower costs and lower complexity. Until now, no digital interface has been presented in the automotive field which is well-suited for off-board communications while providing a solution with relatively low cost and low complexity as compared to existing solutions.

SUMMARY

A controlled device is provided that is operable by a controlling device, remotely located from the controlled device. The controlled device has a transceiver, the transceiver being operable to transmit to and receive digital frame information, including synchronization information having a sync frame, from the controlling device. Circuitry is provided located locally with the transceiver, for providing a recovered clock signal from the synchronization information using the sync frame. The circuitry has neither a crystal clock oscillator nor a phase-locked loop. A driver, connected to the transceiver, is operable to control one or more light emitting diodes according to the recovered clock signal.

BRIEF DESCRIPTION OF THE DRAWINGS

For a more complete understanding of the present disclosure, reference is now made to the ensuing descriptions taken in connection with the accompanying drawings briefly described as follows.

Applicable reference numbers have been carried forward.

DETAILED DESCRIPTION

The foregoing considerations may be addressed in connection with a digital interface to a network of one or more off-board subsystems for controlling automobile subsystems such as vehicle lighting. Such an interface may be compatible with a universal asynchronous receiver transmitter (UART) interface and it may address timing issues by using a protocol starting with a synchronization frame (sync frame), in conjunction with recovering a clock signal, sent by an off-board master device such as a microcontroller unit to a satellite/slave device, off-board. With distance and/or time separating a transmitter and receiver, a clock source from a remote location, undergoes drift. Such drift may primarily result in a change of phase. In order to synchronize operations using a degraded clock signal due to drift, the clock signal preferably has to be adjusted or recovered so that operations using the recovered clock may be synchronized with commands dispatched from the remote location. Many clock recovery methods, using the synchronization information may be used and are contemplated. The protocol herein, permits elimination of a crystal clock oscillator and phase-locked loop at slaves/satellites, thereby dispensing with an otherwise significantly higher cost.

Figure 2:
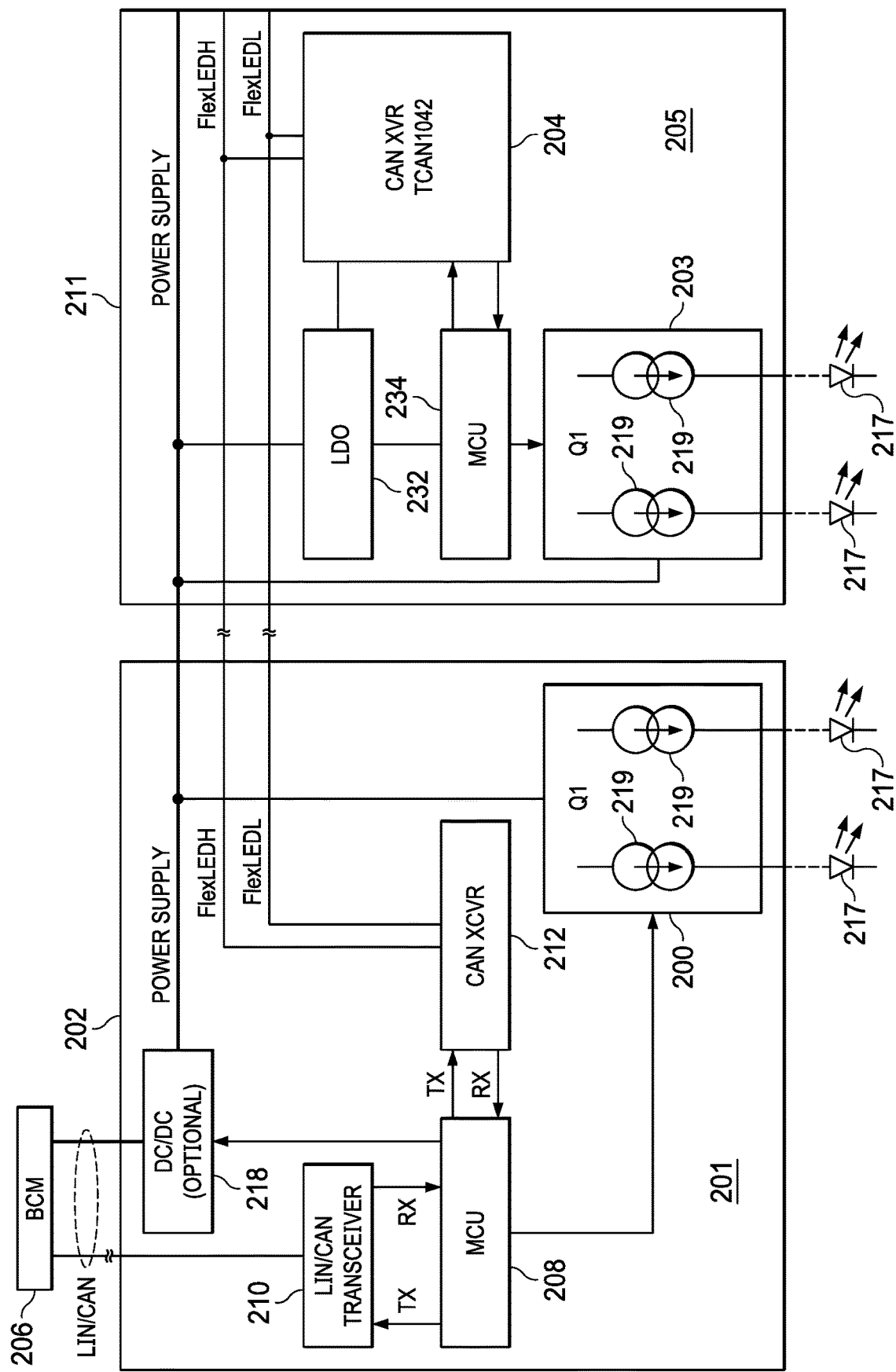
FIG. 2 illustrates a schematic/layout drawing showing a master having a microcontroller and at least one slave/satellite device, on a separate circuit board from the master.

FIG. 2 illustrates a schematic/layout drawing showing master 202 (controlling device) having one driver 200 and at least one satellite or slave 211 (controlled device), with driver 203, on board 205 (board, as used herein, may be a printed circuit board (PCB). In this example, driver 200 and master 202 lie on the same board (such as printed circuit board 201). Master 202 is provided with a driver chip Q1 shown in this example as controlling light emitting diodes (LEDs) 217 (each LED shown being representative of multiple LEDs, for example, 8, 12, 16 or 24 LEDs in number, per driver dedicated output). Master 202 receives instructions from a body control module (BCM) 206 which is an electronic control unit for monitoring and controlling electronic accessories in an automotive vehicle. Master 202 includes a microcontroller unit (MCU) 208 which communicates, over transmit (TX) and receive (RX), lines, with BCM 206 through LIN/CAN transceiver (XCVR) 210. Master 202 also includes CAN transceiver (XCVR) 212 which communicates over transmit (TX) and receive (RX) lines with MCU 208. MCU 208 includes a clock source such as a crystal clock oscillator (not specifically shown). CAN XCVR 212 on board 201 communicates with other CAN transceivers lying off-board such as CAN XCVR 204 on board 205. CAN XCVR 212 may communicate with other CAN transceivers using a two-wire bus such as FlexLED with a sync frame. FlexLED is a network protocol that adds additional protocols over UART+CAN's Physical Layer in an effort to prevent hacking and commands from un-authenticated source such as compromised third party dongles and hacked, over-the-air, in-vehicle updates. As shown, communication with CAN XCVR (212 and 204) takes place using bus lines FlexLEDH and FlexLEDL. An important feature of CAN is that the bus isn't actively driven during logic 'High' transmission—referred to as 'recessive.' During this time, both bus lines are typically at the same voltage, approximately VCC/2. The bus is only driven during 'dominant' transmission, or during logic 'Low.' For instance, assuming a 5V supply (VCC=5 volts), in dominant, the bus lines are driven such that (CANH−CANL)≥2.75V. This allows a node transmitting a 'High' to detect if another node is trying to send a 'Low' at the same time. This is used for non-destructive arbitration, where nodes start each message with an address (priority code) to determine which node will get to use the bus. The node with the lowest binary address wins arbitration and continues with its message. There is no need to back-off and retransmit like other protocols. A direct current (dc) voltage supply or dc-to-dc regulator 218, is located on board 201 and it supplies voltage on-board to driver 200 and off-board to driver 203. Low dropout voltage regulator (LDO) 232 on satellite 211 powers operations on satellite 211 in connection with receiving power on a power supply line (as marked in FIG. 2) from regulator 218. LDO 232 serves to regulate the voltage to satellite 211 without switching noise.

A clock signal from MCU 208 provides timing to driver 200 as well as to other drivers, such as driver 203 on board 205. Driver 203 may drive circuits or components such as LED 217 according to the clock signal. However, in order to avoid clock drift, a synchronization frame is sent with every message transmission transaction. The synchronization frame, also referenced as a "sync frame" may, for instance, include a sequence of bits in a marker pattern with good autocorrelation which may be used at a receiving end to determine the transmission message start time. In connection with receiving, at a transceiver 204, a Start bit (such as that represented in connection with a high to low transition where the low state (dominant) continues for a specified time (so as to be distinguished from a glitch)), the oscillator (not shown) in the receiver is used to generate a sampling at typically 16 times the baud rate. So if a Start bit is sufficiently low for enough sample points, then the synchronization is attempted using the sync frame. For clock recovery, the sampling of the sync frame may optimally occur at a greater rate than the baud rate. Having a known sync pattern in a sync frame enables the synchronization in connection with comparing known times between rising edges with measured times (measured counts). This enables the calculation of the frequency for recovery of the clock at the receiving end such as MCU 234 in connection with receipt of a message received by CAN transceiver (XCVR) 204. There is no need for MCU 234 to contain a phase-locked loop or a crystal clock oscillator.

Figure 3:
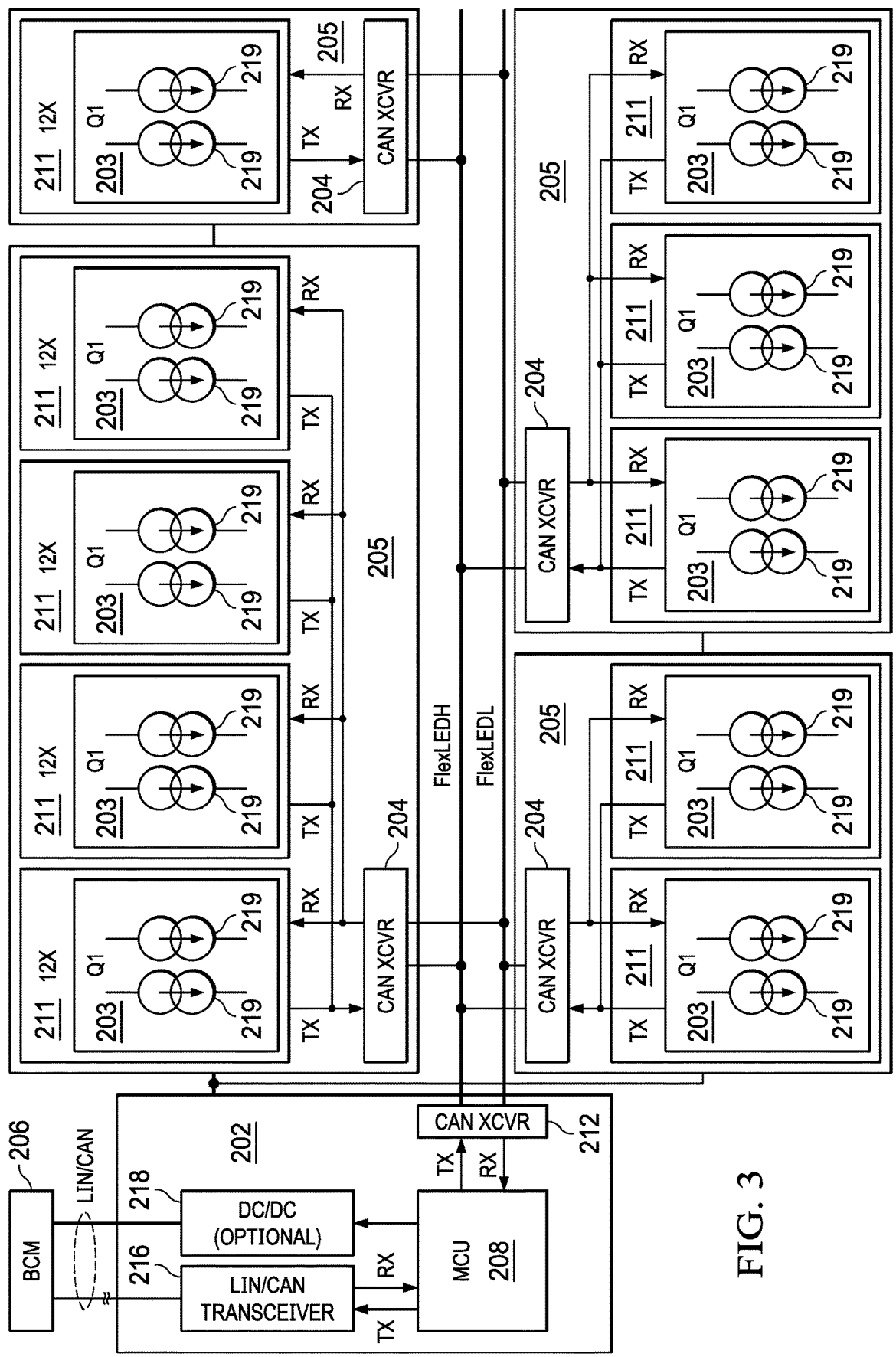
FIG. 3 illustrates a schematic/layout drawing showing another example of an implementation of the foregoing shown in FIG. 2, having a master and several satellite/slaves without a corresponding MCU on the satellite/slave board.

FIG. 3 illustrates a schematic/layout drawing showing another example of an implementation of the foregoing shown in FIG. 2, having a master 202 and several satellite/slaves 211 without a corresponding MCU on the satellite/slave board 205. CAN XCVR 212 (on Master 202) and XCVR 204 on satellite/slave(s) 211 convert the single-ended UART signals (TX, RX) to differential signal pairs (FlexLEDH, FlexLEDL) and vice versa. While the CAN XCVRs do not code/decode in this topology, the sync frame issuing from CAN XCVR 212, as determined by MCU 208 on master 202 (per the FlexLED protocol as noted herein), is able to provide the relevant clock frequency to slave devices on slaves 211. Slave device (e.g., devices lying on board 205) such as MCU 234 (FIG. 2) or XCVR 204 (FIG. 3) may use the sync frame, accordingly, to adjust the relevant clock frequency from MCU 208 on master 202. There is no need to have an expensive clock generated by an MCU on a board at a satellite/slave. As a consequence, the applicable clock may be recovered without a crystal clock oscillator at satellite/slave MCU, such as the case with that shown with reference to FIG. 2 or it may be recovered by the receiving CAN XCVR 204 of FIG. 3, at board 205 of the satellite/slave 211 in connection with receiving a sync frame through signals on differential signal pair (FlexLEDH, FlexLEDL) from the CAN XCVR 212 (on master 202).

Figure 4:
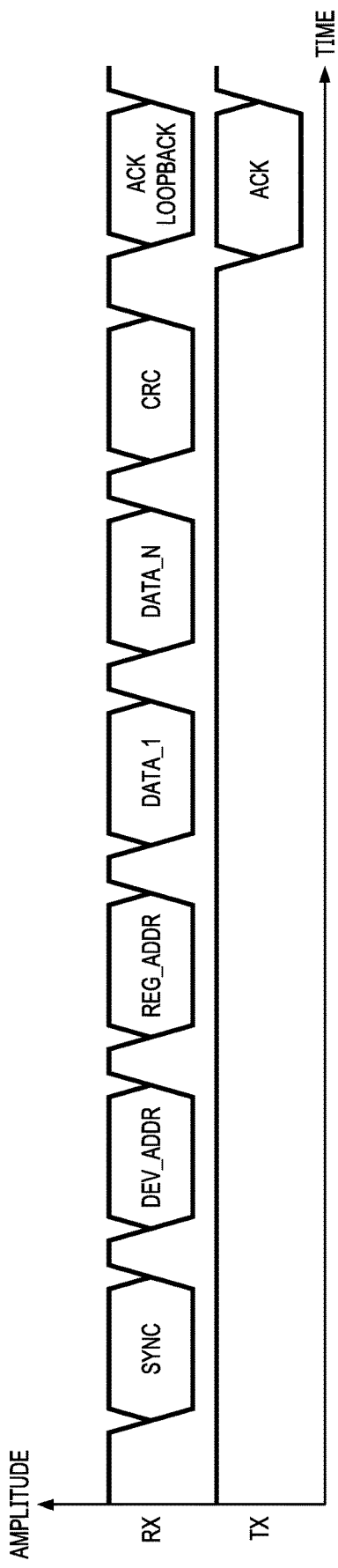
FIG. 4 illustrates a timing diagram showing various receive and transmit activities on the transmit and receive lines.

FIG. 4 illustrates a transaction, for one example, for a UART-based dual-wire interface and timing diagram for activities on the transmit and receive lines between CAN XCVR 212 to CAN XCVRs 204. The transmissions may be half duplexed in that they may make use of separate transmit-left and transmit-right bus lines, or they may, alternatively, be used with hardware or software to allow non-simultaneous transmissions, in either direction, on a shared bus line between two transceivers. According to one example, a networking protocol, as exhibited by the transmission of six frames, is as follows: a sync frame, for synchronization and clock recovery; a device address/data transmission mode frame, DEV_ADDR; a register address, REG_ADDR; a DATA N byte number, indicative of the Nth data byte; and a cyclical redundancy (CRC) frame, e.g., 8 bits. Dev_Addr may signify to which device a message is sent. The REG_ADDR may designate which specific register at a device that the message is directed. For instance, in an automotive application, a message may be sent or received concerning the control or status of a particular LED in a particular sub-system as addressed by the DEV_ADDR and REG_ADDR frames. An MCU, such as MCU 234, may receive the information noted by receive waveform RX. According to a multi-byte UART-based protocol as used herewith, a message acknowledgement (ACK) may occur near the end of a CAN message to verify receipt of messages between a message transmitter and all message receivers. Satellite/slave drivers acknowledge receipt of a message, even those intended for others. An acknowledgment to the transmitter may occur even if the expected receiver is not present on the network. Consequently, receipt of an ACK is not an acknowledgement of a data transfer between a transmitter and a designated receiver, or confirmation that an action has been taken, but rather a confirmation that all network nodes agree that the CAN message did not violate any Data Link Layer protocol rules. The Data Link Layer protocol is a protocol governing detection and recovery from message collisions on a bus. Transmissions may occur from a Master to a Satellite as well as from a Satellite to a Master. For lighting systems, this allows an MCU, such as MCU 234, to cause transmission of information and status reports back to MCU 208 at Master 202 concerning such things as specific LED fixture outages. In addition, MCU 208 may control specific LEDs through messages sent to devices off-board from board 201 on satellites such as Satellite 211 on board 205. In one example, transmissions may be sent using pulse width modulation (PWM).

Figure 5:
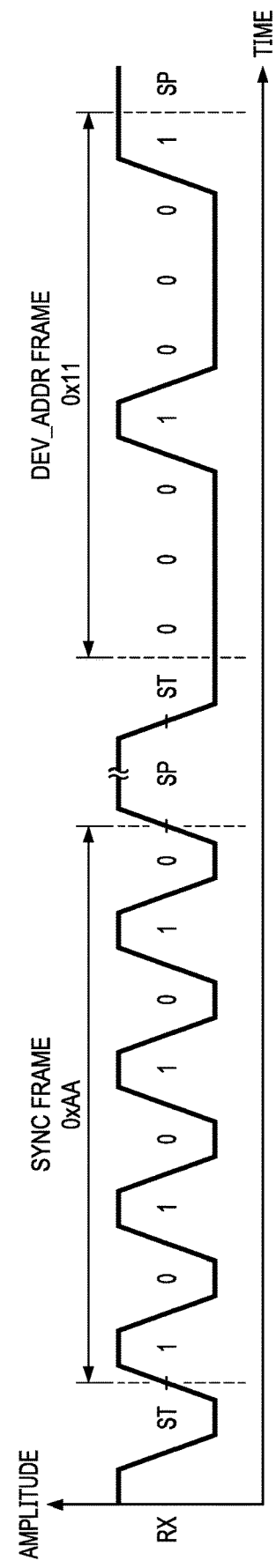
FIG. 5 illustrates a timing diagram showing specific bit sequences in received data in a sync frame and a device address frame.

FIG. 5 illustrates a timing diagram showing specific bit sequences in received data in a sync frame and a device address frame, DEV_ADDR, (this example having 8 bits in the frame). A sequence with good auto correlation is shown for the sync frame pattern of 10101010. In one example, there is one data byte per transaction. In one example, the frame starts with a start bit ST and ends with stop bit SP. After this stop bit SP following the sync frame, shown for example by frame designation, 0xAA, a device address frame follows at frame 0x11. In one example, there are 8 bits per sync frame. An alternating pattern of logic ones and zeros provides a basis for a transceiver to lock on to the clock after the start bit is detected (for example, in connection with a dominant transition). Once the lock occurs, a stop bit is encountered at the end of the sync frame. As shown in FIG. 5, a start bit precedes a device address frame which may include an 8 bit address followed by a stop bit.

In connection with a XCVR 204 on satellite 211 (as shown in FIG. 2) receiving a Start bit (high to low transition where the low state (dominant scheme) continues for a specified time (so as to be distinguished from a glitch), a non-crystal clock oscillator (not shown) within XCVR 204 is used to generate a sampling that is faster than the associated the baud rate. Satellite 211 benefits from not having a crystal clock oscillator, an otherwise expensive component/element. It also does not need or have a phase-locked loop circuit, an also otherwise expense. If a Start bit stays sufficiently low for a long enough period of sample points (so as to distinguish it from a glitch), then synchronization is attempted using the sync frame that is encountered in the data stream. Having a known sync pattern in a sync frame enables detection of the pattern and enables time synchronization in connection with comparing known times between rising pulse edges with measured times of rising pulse edges at the receiver. Counts (a pulse based measurement) between rising edges are used to calculate and reproduce the clock frequency. The count is used in a manner similar to determining a moving-average which allows calculation of the pulse width of the sync pulse pattern. The synchronization may be detected by digital circuits within XCVR 204 for the example shown in FIG. 3. Alternatively, the synchronization may be detected by circuits within MCU 234 or XCVR 204 of FIG. 2. By knowing the pulse-width, the clock frequency for communication with the master is known. This same frequency may be used in transmitting information to the master 202.

Figure 6:
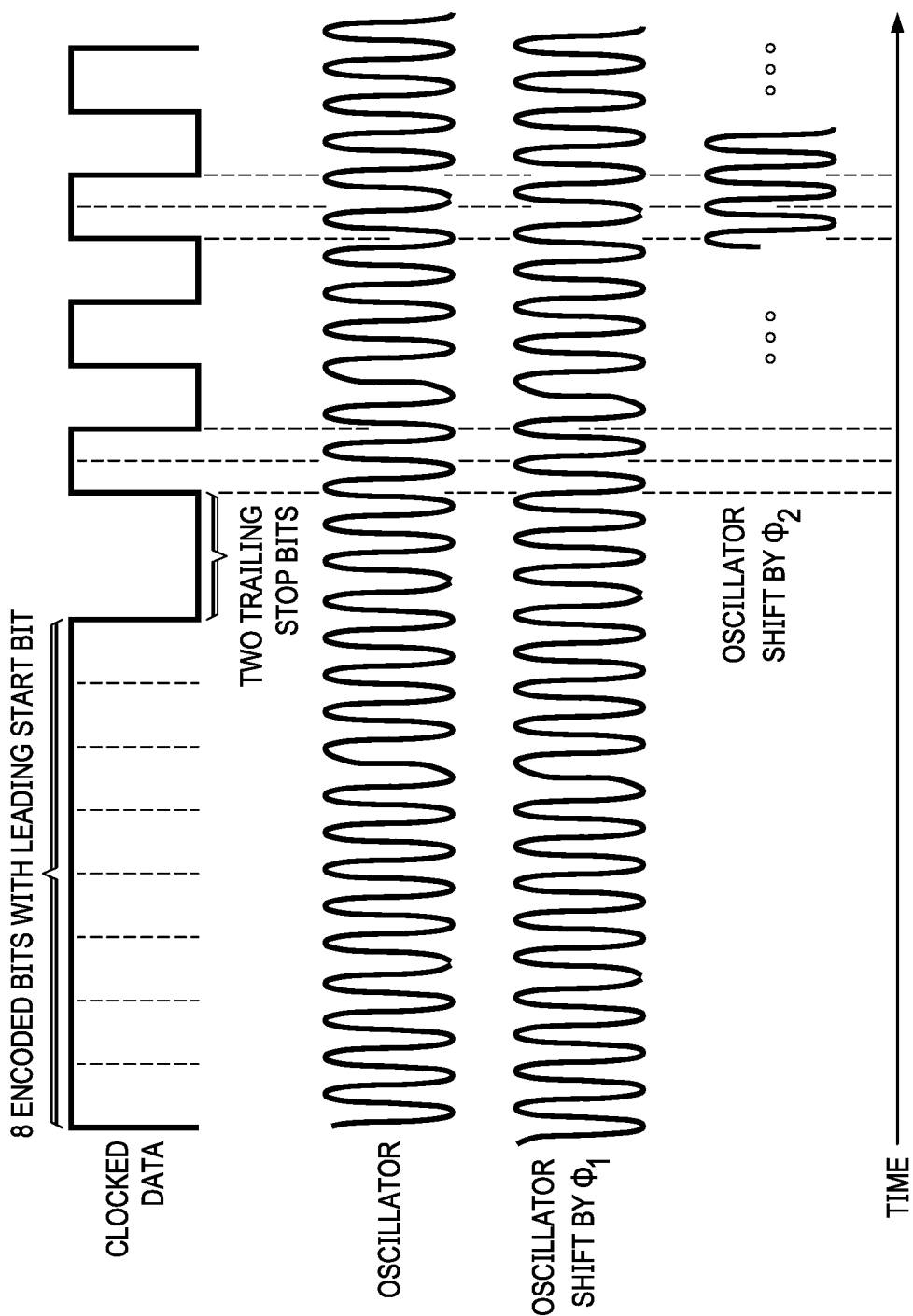
FIG. 6 illustrates timing diagrams according to one simplified clock recovery scheme.

FIG. 6 illustrates timing diagrams according to one simplified clock recovery scheme. Clocked data from Master 202 of FIG. 2 is received by a satellite 211. Eight encoded bits with a leading start bit, the start sequence, are received at a satellite 211 followed by a two trailing stop bits (logic low). This example shows a non-dominant scheme different from examples employing a dominant scheme wherein a number of encoded bits (for example 4-11 bits) begin with a leading start bit having a logic high to low transition followed by two trailing stop bits of logic high. Thereafter, a pattern of alternating logic ones and zeros, (a sync sequence) in a sync frame, are received at a satellite 211.

Figure 7:
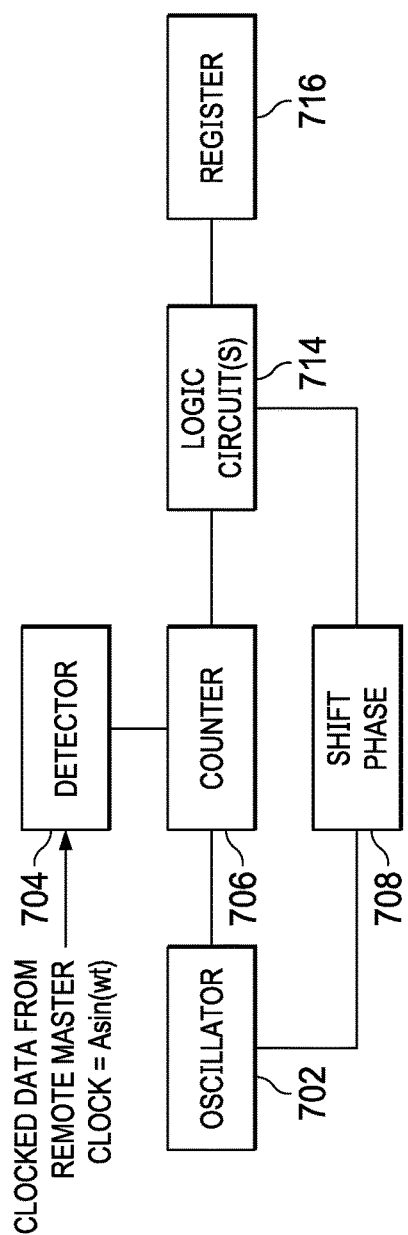
FIG. 7 illustrates a block diagram showing digital circuits which may implement the clock recovery scheme according to the clock recovery implementation of FIG. 6.

FIG. 7 illustrates a block diagram showing digital circuits which may implement the clock recovery scheme according to the clock recovery implementation according to FIG. 6. Clocked data from Master 202 (FIG. 2) may be detected by detector 704 which samples, according to oscillator 702, the clocked data received from master 202. Oscillator 702 is a non-crystal clock oscillator (which may be considered a relatively high speed oscillator) on satellite 211 within XCVR 204 (FIG. 2). A non-crystal oscillator as used herein throughout means an oscillator that does not include a crystal. Crystal oscillators are generally more expensive than oscillators that do not have crystals. Counter 706, which may be in satellite 211, counts the number of high bits in the clocked data according to each high oscillator pulse. The encoded sequence of eight bits are known and an expected number, N, of high pulses corresponds to detection of the 8 encoded bits with a leading high start bit.

Figure 8:
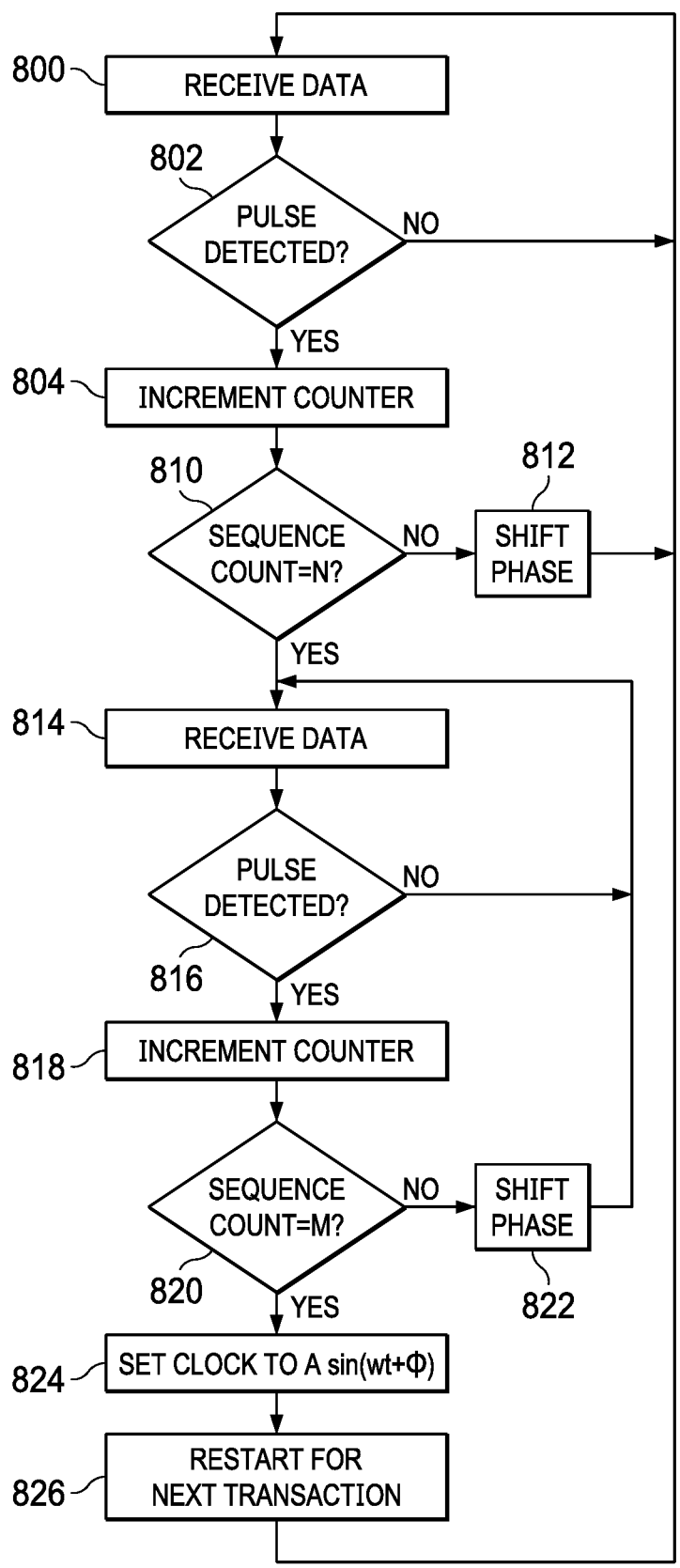
FIG. 8 illustrates a corresponding flow chart for the timing diagram of FIG. 6 and the block diagram of FIG. 7.

FIG. 8 illustrates a corresponding flow chart for the timing diagram of FIG. 6 and the block diagram of FIG. 7. Reference shall now be made to FIGS. 6, 7 and 8. At step 800 data is received. If a pulse is detected at step 802, the counter is incremented at step 804. A decision is made at step 810 as to whether the count is equal to N signifying that the start sequence has been detected. If the answer is no, the phase is shifted for the oscillator by a predetermined amount and more data is received at step 800.

Should the count of detected high bits not equal the expected number, N, then the phase Φ is incremented at step 812 by a known amount by phase shifter 708 (FIG. 7) in XCVR 204 (FIG. 2). Shifting the phase of oscillator 702 causes detector 704 to sample at points shifted in time from the previous sampling times of the clocked data. The sampling rate should be fast enough to accommodate the sampling of the 8 encoded bits sufficient to allow the detection of the requisite number of pulses, N, as time progresses despite shifting the phase of oscillator 702. For the example shown in FIG. 6, should the count of a detected start sequence be determined with high bits equal to the expected number, N, (decision at step 810 being yes, as made by logic circuit(s) 714) then detector 704 is used to detect a sync sequence in connection with counter 706 counting the requisite number, M, of high bit pulses (as determined by logic circuit(s) 714) indicative of detection of the sync sequence matching the known sync frame data. As such, data is received at step 814 and a decision is made as to whether a pulse is detected at step 816. If a pulse is detected, counter 706 is incremented at step 818. Should the requisite number of sync counts not be obtained (as determined at step 820), then the phase Φ is incremented at step 822 by a known incremental amount by phase shifter 708 in XCVR 204 (FIG. 2), shifting the phase of oscillator 702. The phase shifting continues until such time as the period set for shifting the phase expires or becomes equal to the phase necessary to recover the clock from master 202. FIG. 6 shows an oscillator waveform and two additional oscillator waveforms each shifted, respectively, by $\Phi_1$ and $\Phi_2$. As shown by the $\Phi_2$ phase shifted oscillator waveform (the dashed lines which indicate sampling points in time), the $\Phi_2$ phase shifted oscillator waveform peaks line up with the three points on a high pulse from the sync frame sequence which follows the two trailing stop bits. M for the example shown in FIG. 6 may be 3.

Once the requisite number of pulses, M, is counted by counter 706, as determined at decision step 820, then the current phase Φ (which in this instance may, for example, be $\Phi_2$) is used as the phase shift for the clock signal used on satellite 211 at step 824, thereby recovering the clock signal from and on master 202. This phase shift used for the recovered clock signal is stored in register 716. As shown in step 816, the clock recovery stops at this point and the clock recovery steps are repeated at step 826 in connection with the next message transaction. Assuming a sinusoidal waveform for the clock from master 202, of A*sin(wt), where A is the amplitude (a scalar), t is time (often measured in seconds) and w is the angular frequency (which is often measured in radians per second) the recovered clock signal used on satellite 211 has an equation given by A*sin (wt+Φ) where Φ is the phase. In this example, w at master 202 is known at satellite 211. Clock drift results in a phase offset at satellite 211. For example, should the count equal M, when the value of Φ equals $Φ_2$, then the recovered clock used on satellite 211 may be represented by A*sin (wt+$Φ_2$).

The conditional statements carried out in decision symbols 810 and 816 and 820 may be implemented by digital logic circuits (not shown).

Figure 9:
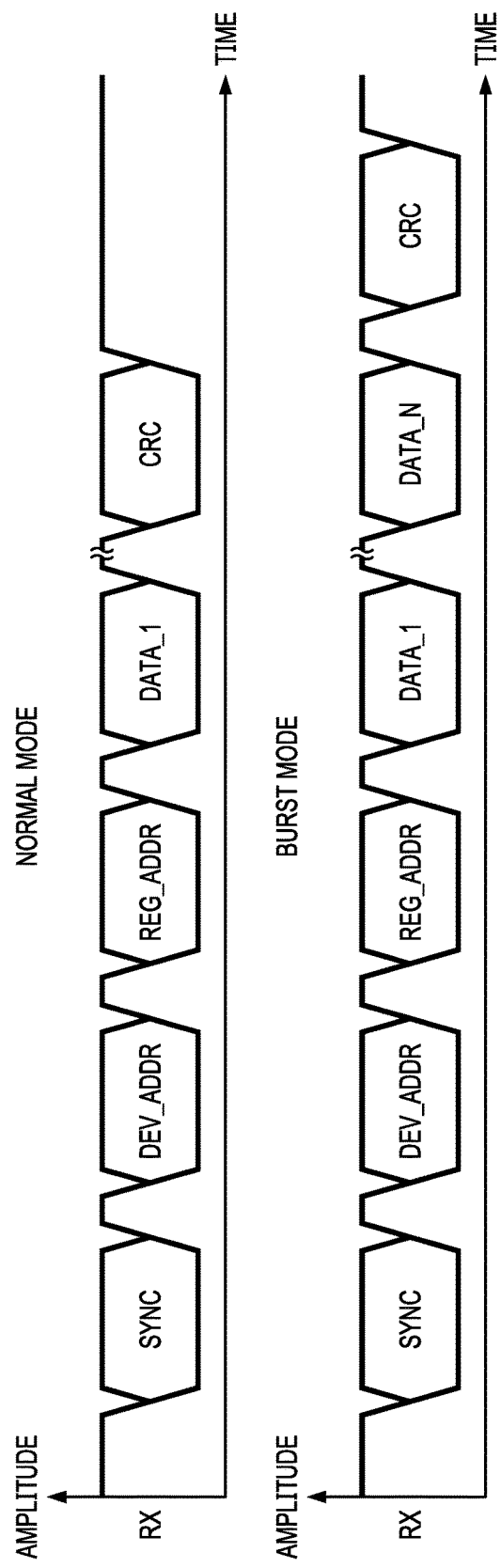
FIG. 9 illustrates a timing diagram showing a normal mode and a burst mode frame transaction.

Simplified pseudo code carrying out the foregoing clock recovery scheme follows:
If Pulse detected, then increment counter*Search for start sequence
If pulse detected, increment counter;
Otherwise receive next data;
If sequence count not equal to N, then shift phase;
If not equal, then increment phase of oscillator;
Repeat until timeout or start sequence count equals to N;
If sequence count equals to N, then receive data*Start search for sync frame
If pulse is detected, increment counter;
Otherwise receive data;
If sync count equal to M, set phase for clock
Otherwise, increment phase of oscillator;
Repeat until timeout or sync count equals to M;

The foregoing will allow transmission of data or commands on an expedited basis. For instance, the DEV_ADDR frame may enable a burst mode operation. FIG. 9 illustrates a timing diagram showing frame activity for a normal mode of operation and a burst mode of operation for comparison. Each frame may occur between a start and stop bit (not shown). The burst mode, may be distinguished from the normal mode in that data frames may be transmitted consecutively in an effort to save communication overhead and achieve higher throughput. A longer chain of cyclical redundancy bits is required for such operation. Transferring high speed data offboard from an MCU, such as MCU 208, to a driver 203 is greatly facilitated by the forgoing described burst mode.

The foregoing is compatible with CAN electromagnetic compatibility/electrostatic discharge (EMC/ESD) considerations. Further, it provides an overall cost benefit as compared with a strictly CAN system in that the satellite/slave devices have no crystal clock oscillators. The foregoing architecture and protocol also permits burst-mode and allows error checking. As a further advantage, the foregoing is easily adaptable for use with MCUs using universal asynchronous receiver transmitter (UART) modules.

Figure 1:
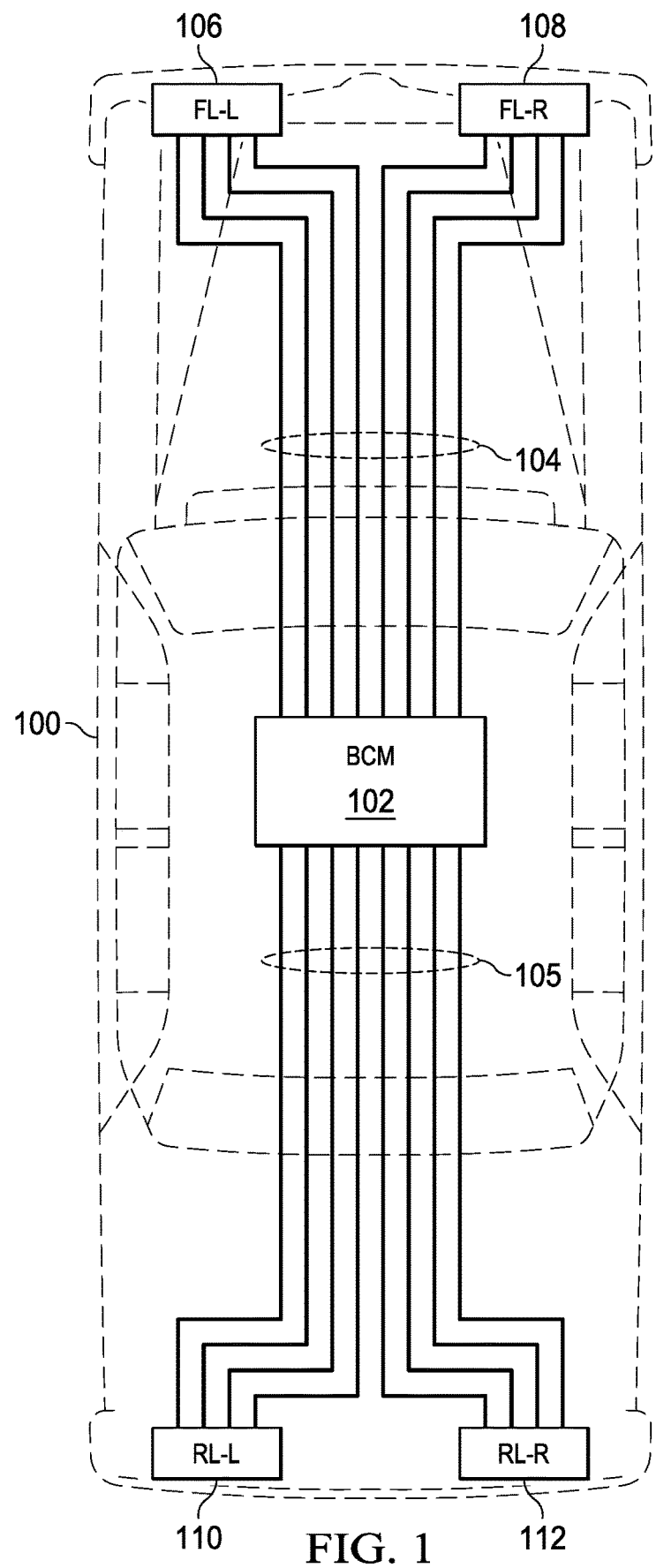
FIG. 1 illustrates a layout of a wiring arrangement for an automobile.
Figure 10:
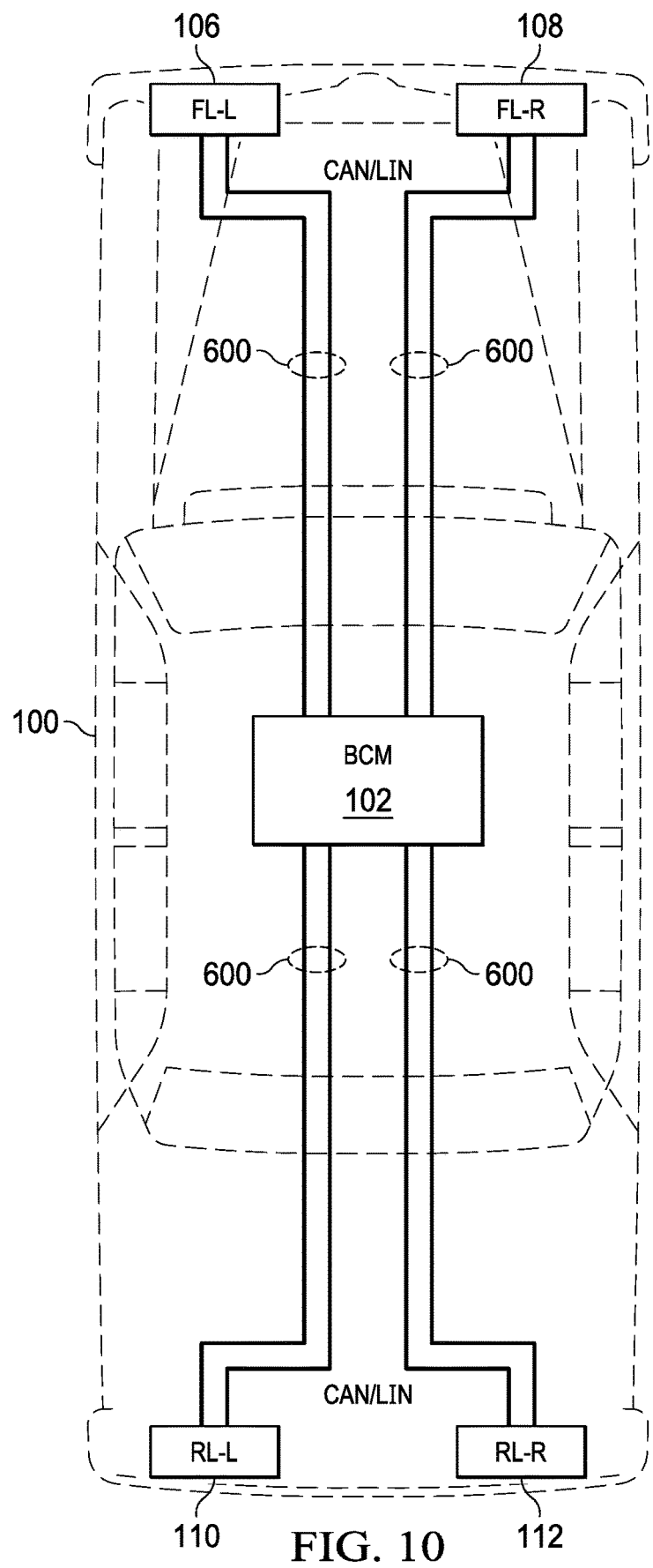
FIG. 10 illustrates a lighting system which reduces the number of wires used for communication down to a 2-wire bus.

FIG. 10 illustrates a layout of a wiring arrangement for automobile 100 according to the system and protocol herein. The foregoing may be used with controlling lights, such as automobile front lights, parking lights, back lights, turn signals and stop lights, etc. In contrast with the layout shown in FIG. 1, a lighting system, used with this example greatly reduces the number of wires used for communication down to a 2-wire bus 600, while enabling control and reduced cost as compared with a more wire-intensive system.

The lighting systems referenced herein are particularly pertinent to LED lighting. However, other lighting is contemplated as well. The foregoing protocol is not limited for LED lighting as it may also be used in other automotive applications such as motor drivers, battery management, etc.

The foregoing provides a digital interface for transferring data according to a CAN/LIN protocol which is converted to a FlexLED protocol for use by drivers and slave devices off-chip that may greatly allow increased control (as compared with present systems) of functionality covering such things as tail light, brake light and front and back light operation on an automobile. Such control may allow standard light functionality in addition to animation effects involving LED timing and/or color.

A resulting smaller wiring harness may significantly reduce vehicle weight (as a consequence of using many fewer wires by comparison with those of current methods) and it allows smart control of lighting (via microcontroller) with reporting and diagnostics possible on individual lamps/LEDs.

The foregoing microcontrollers may be programmed according to variety of programming/processing methods to result in sophisticated control of systems, such as lighting, using a 2-wire bus. Such programming will permit monitoring and control of systems and subsystem with increased flexibility. Such programming is contemplated as also being configurable from remote locations, within constraints of security protocols, and readily updatable.

The foregoing has been described herein using specific embodiments for the purposes of illustration only. It will be readily apparent to one of ordinary skill in the art, however, that the principles of the invention can be embodied in other ways. Therefore, the disclosure should not be regarded as being limited in scope to the specific examples disclosed herein, but instead as being fully commensurate in scope with the following claims.

We claim:

1. A controlled device, operable by a controlling device, remotely located from the controlled device, the controlled device comprising:
   a transceiver operable to transmit to and receive digital frame information, including synchronization information having a sync frame, from the controlling device;
   circuitry for providing a recovered clock signal from the synchronization information using the sync frame, the circuitry having a non-crystal oscillator; and
   a driver, connected to the transceiver, operable to control one or more light emitting diodes according to the recovered clock signal.

2. The controlled device as recited in claim 1 wherein the circuitry comprises:
   a detector coupled to the non-crystal oscillator;
   a counter coupled to the detector; and
   a phase shifter coupled to the non-crystal oscillator.

3. The controlled device as recited in claim 1, wherein the circuitry is located in the transceiver.

4. A controlled device operable by a controlling device, remotely located from the controlled device, comprising:
   a microcontroller;
   a transceiver connected to the microcontroller, the transceiver being operable to transmit to and receive from the controlling device, digital frame information having synchronization information including a sync frame;
   circuitry for recovering a clock signal from the synchronization information using the sync frame, the circuitry having a non-crystal oscillator; and
   a driver, coupled to the transceiver, operable to control one or more light emitting diodes according to the recovered clock signal.

5. The controlled device as recited in claim 4, wherein the circuitry comprises:
   a detector coupled to the non-crystal oscillator;
   a counter coupled to the detector; and
   a phase shifter coupled to the non-crystal oscillator.

6. The controlled device as recited in claim 4 wherein the circuitry is located in the transceiver.

7. The controlled device as recited in claim 4 wherein the circuitry is located in the microcontroller.

8. A controlled device operable by a controlling device and remotely coupled to the controlled device by a bus, the controlled device comprising:
   a detector operable to receive clocked data, having a clocked frequency and including a sync frame that is predetermined bits long, from the controlling device;
   a counter coupled to the detector, the counter operable to count a number of bits in a portion of the clocked data;
   a non-crystal oscillator having an output coupled to the detector, the non-crystal oscillator outputs an oscillating signal having a frequency and a phase;
   phase shift circuitry coupled to the output of the non-crystal oscillator, the phase shift circuitry for incrementing the phase of the oscillating signal until the count by the counter matches the predetermined bit length resulting in a phase-incremented oscillating signal; and
   wherein the phase-incremented oscillating signal clocks the controlled device.

9. The controlled device of claim 8, wherein the controlled device is a slave and the controlling device is a master.

10. The controlled device of claim 8, wherein at least one controlled device is remotely coupled to the controlling device.

11. The controlled device of claim 8, wherein the bus consists of up to one power conductor and two data conductors.

12. The controlled device of claim 8, wherein the controlled device is used in an automotive communication system.

* * * * *